(12) United States Patent
Moffitt

(10) Patent No.: US 8,601,415 B2
(45) Date of Patent: Dec. 3, 2013

(54) PLANNING FOR HARDWARE-ACCELERATED FUNCTIONAL VERIFICATION

(75) Inventor: Michael D Moffitt, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/447,055

(22) Filed: Apr. 13, 2012

(65) Prior Publication Data
US 2013/0275931 A1    Oct. 17, 2013

(51) Int. Cl.
*G06F 17/50*    (2006.01)

(52) U.S. Cl.
USPC ........... 716/106; 716/100; 716/101; 716/102; 716/103; 716/104; 716/105; 716/107; 716/110; 716/111; 716/136

(58) Field of Classification Search
USPC ......................... 716/100–107, 110–111, 136
See application file for complete search history.

(56) References Cited

U.S. PATENT DOCUMENTS

| | | | |
|---|---|---|---|
| 5,329,470 A * | 7/1994 | Sample et al. .................. | 703/28 |
| 5,841,967 A | 11/1998 | Sample et al. | |
| 6,910,192 B2 | 6/2005 | McConaghy | |
| 7,260,794 B2 | 8/2007 | Butts | |
| 7,290,228 B2 | 10/2007 | Guenther et al. | |
| 7,409,670 B1 | 8/2008 | Pritchard et al. | |
| 7,509,246 B1 | 3/2009 | Molson et al. | |
| 7,865,847 B2 | 1/2011 | Master | |
| 8,001,505 B2 * | 8/2011 | Bist et al. ....................... | 716/106 |
| 2003/0188278 A1 * | 10/2003 | Carrie .............................. | 716/4 |

OTHER PUBLICATIONS

Trevor Conrad Meyerowitz, Single and Multi-CPU Performance Modeling for Embedded Systems, Apr. 14, 2008, 191 pages.
Debapriya Chatterjee et al., GCS: High-Performance Gate-Level Simulation with GP-GPUs, 2009, 6 pages.
Michael D. Moffitt et al., Scalable Scheduling for Hardware-Accelerated Functional Verification, 2011, 8 pages.
Michael D. Moffitt et al., Robust Partitioning for Hardware-Accelerated Functional Verification, 2011, 6 pages.
John Darringer et al., EDA in IBM: Past, Present, and Future, Dec. 2000, 22 pages.
F. Focacci et al., Solving Scheduling Problems with Setup Times and Alternative Resources, 2000, 10 pages.
Bernat Gacias et al., Parallel Machine Scheduling with Precedence Constraints and Setup Times, 2010, 28 pages.

(Continued)

*Primary Examiner* — Nghia Doan
(74) *Attorney, Agent, or Firm* — Kolisch Hartwell, PC; Matthew W. Baca

(57) ABSTRACT

Methods, systems, and computer program products may provide planning for hardware-accelerated functional verification in data processing systems. A method may include receiving, by a computer system, a description of architecture of a hardware accelerator for accelerating functional verification of a circuit design, the architecture including a plurality of logical processors. The method may additionally include receiving, by the computer system, a description of the circuit design having a plurality of gates, and representing, by the computer system, each gate, each stage of the functional verification, and each logical processor as a separate object based on the received description of the architecture and the circuit design. The method may further include representing, by the computer system, relationships between gates as pairwise edges, and defining, by the computer system, a goal state that requires each gate to be scheduled for execution by a logical processor during a stage of the functional verification.

25 Claims, 7 Drawing Sheets

(56) References Cited

OTHER PUBLICATIONS

Michael L. Pinedo, Scheduling: Theory, Algorithms, and Systems, 2008, 664 pages, Third Edition, Springer.

Isto Aho et al., On a Parallel Machine Scheduling Problem with Precedence Constraints, 2006, 3 pages, Springer Science + Business Media, LLC.

* cited by examiner

PLANNING FOR HARDWARE-ACCELERATED FUNCTIONAL VERIFICATION

BACKGROUND

The present inventions relate generally to data processing systems, and more specifically, to data processing systems having a capability to plan hardware-accelerated functional verification of a circuit design.

Functional verification is the task of verifying that a logic design conforms to a specification. Functional verification may include simulating the logic design of an integrated circuit using software-based simulators that are facilitated by hardware accelerators. Hardware accelerators are special-purpose machines that can increase performance by several orders of magnitude, reducing otherwise month-long simulations to days or even hours. The hardware accelerators are programmed by loading its memory with an instruction stream produced prior to simulation by a compiler that schedules each logical primitive at a specific time on a specific processor.

BRIEF SUMMARY

According to one embodiment, a method may include receiving, by a computer system, a description of architecture of a hardware accelerator for accelerating functional verification of a circuit design, the architecture including a plurality of logical processors. The method may additionally include receiving, by the computer system, a description of the circuit design having a plurality of gates. The method may further include representing, by the computer system, each gate of the plurality of gates, each stage of a plurality of stages of the functional verification, and each logical processor of the plurality of logical processors as a separate object based on the received description of the architecture and the received description of the circuit design. The method may additionally include representing, by the computer system, relationships between gates of the plurality of gates as pairwise edges. The method may further include defining, by the computer system, a goal state that requires each gate of the plurality of gates to be scheduled for execution by a logical processor of the plurality of logical processors during a stage of the plurality of stages of the functional verification.

According to one embodiment, a computer system may include a processor and a memory. The computer system may additionally include a program comprising a plurality of instructions stored in the memory that are executed by the processor to receive a description of architecture of a hardware accelerator for accelerating functional verification of a circuit design, the architecture including a plurality of logical processors. The plurality of instructions additionally comprises instructions that are executed by the processor to receive a description of the circuit design having a plurality of gates, and to represent each gate of the plurality of gates, each stage of a plurality of stages of the functional verification, and each logical processor of the plurality of logical processors as a separate object based on the received description of the architecture and the received description of the circuit design. The plurality of instructions further comprises instructions that are executed by the processor to represent relationships between gates of the plurality of gates as pairwise edges, and define a goal state that requires each gate of the plurality of gates to be scheduled for execution by a logical processor of the plurality of logical processors during a stage of the plurality of stages of the functional verification.

According to one embodiment, a computer program product for planning hardware-accelerated function verification may include at least one computer readable storage medium having computer readable program instructions embodied therewith. The computer readable program instructions, when read by a processor, may be configured to receive a description of architecture of a hardware accelerator for accelerating functional verification of a circuit design, the architecture including a plurality of logical processors. The computer readable program instructions, when read by a processor, are additionally configured to receive a description of the circuit design having a plurality of gates, and represent each gate of the plurality of gates, each stage of a plurality of stages of the functional verification, and each logical processor of the plurality of logical processors as a separate object based on the received description of the architecture and the received description of the circuit design. The computer readable program instructions, when read by a processor, are further configured to represent relationships between gates of the plurality of gates as pairwise edges, and define a goal state that requires each gate of the plurality of gates to be scheduled for execution by a logical processor of the plurality of logical processors during a stage of the plurality of stages of the functional verification.

Any of the above embodiments may be embodied as computer-based methods, systems, or program products.

DETAILED DESCRIPTION

Figure 1:
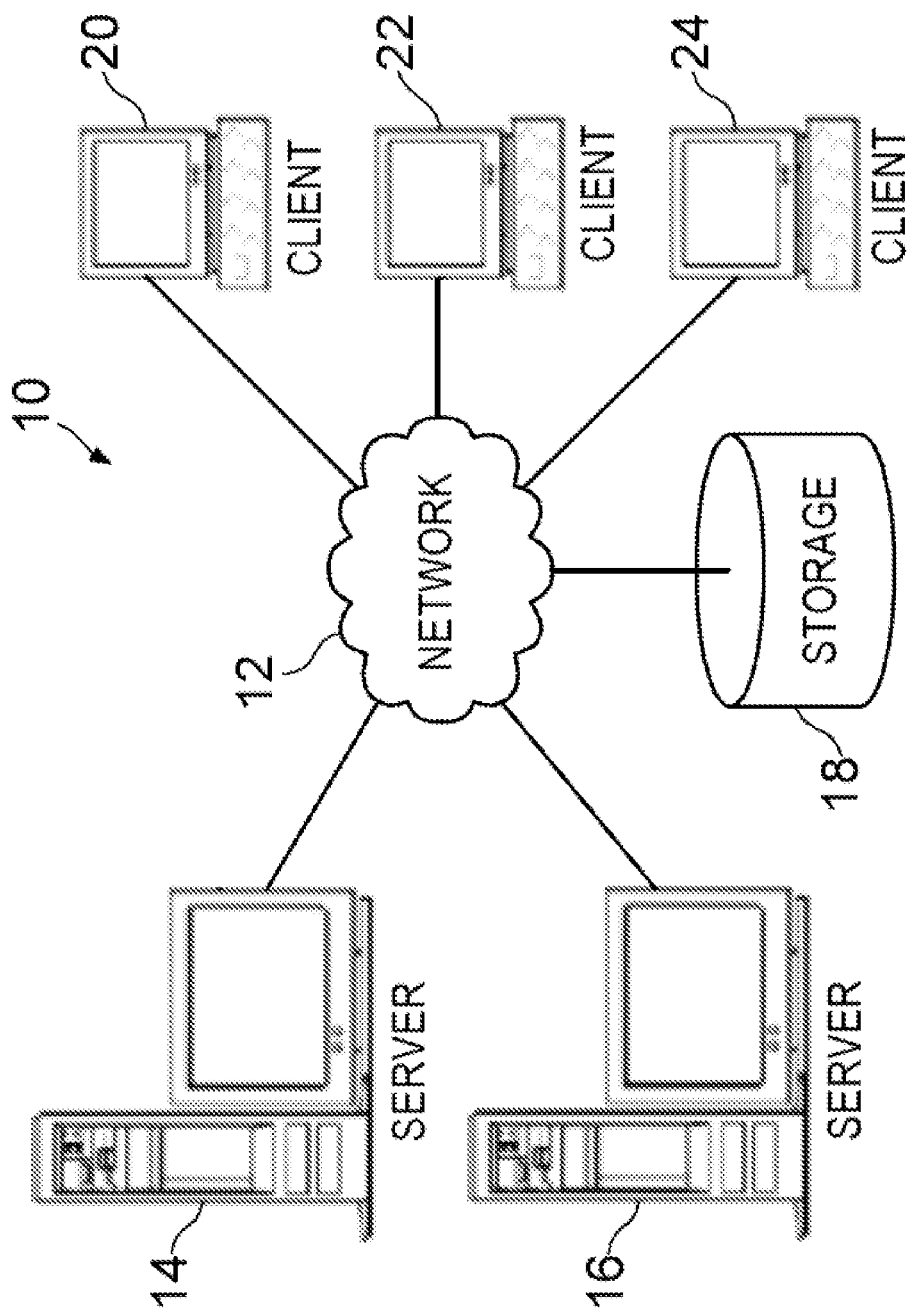
FIG. 1 is a pictorial representation of an example of a computer system in which illustrative embodiments may be implemented.

As will be appreciated by one skilled in the art, aspects of the present inventions may be embodied as a system, method or computer program product. Accordingly, aspects of the present inventions may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present inventions may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present inventions may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present inventions are described below with reference to flowchart illustrations and/or block diagrams of methods, apparatus (systems) and computer program products according to embodiments of the inventions. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions that execute on the computer or other programmable apparatus provide processes for implementing the functions/acts specified in the flowchart and/or block diagram block or blocks.

Figure 2:
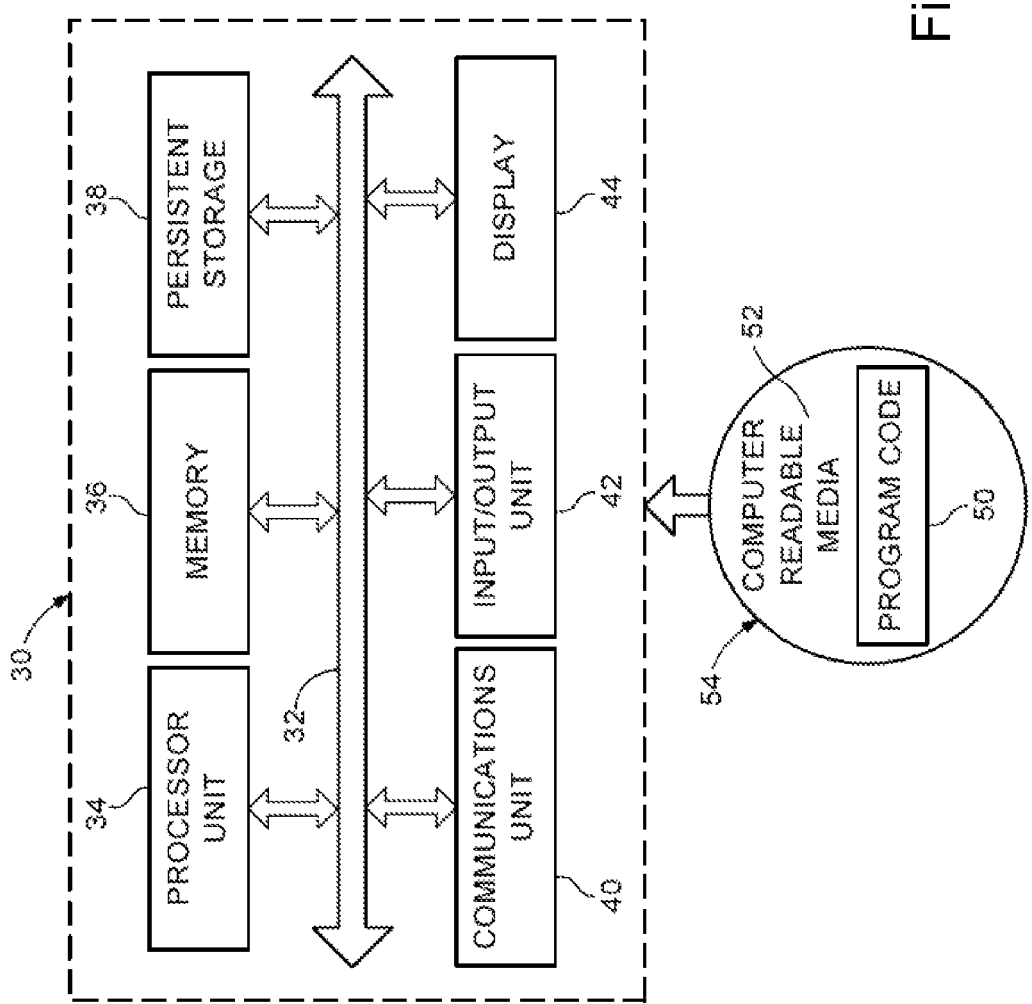
FIG. 2 is a block diagram of an example of a computer in which illustrative embodiments may be implemented.

With reference now to the figures and in particular to FIGS. 1 and 2, exemplary diagrams of data processing environments are provided in which illustrative embodiments may be implemented. It should be appreciated that FIGS. 1 and 2 are only exemplary and are not intended to assert or imply any limitation with regard to the environments in which different embodiments may be implemented. Many modifications to the depicted environments may be made.

The flowcharts and block diagrams in the figures illustrate the architecture, functionality, and operation of possible implementations of systems, methods and computer program products according to various embodiments of the present inventions. In this regard, each block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

FIG. 1 depicts a computer system, indicated generally at 10, and including a network of computers in which illustrative embodiments may be implemented. Computer system 10 may contain a network 12, which is the medium used to provide communications links between various devices and computers connected together within computer system 10. Network 12 may include connections, such as wire, wireless communication links, or fiber optic cables, or combinations of such connections.

In the depicted example, a server 14 and a server 16 may connect to network 12 along with a storage unit 18. In addition, one or more client computers may connect to network 12, such as a first client computer 20, a second client computer 22, and a third client computer 24. Client computers 20, 22, and 24 may be, for example, personal computers work stations, or network computers. In the depicted example, server 14 may provide data, such as boot files, operating system images, and/or software applications to client computers 20, 22, and 24. Client computers 20, 22, and 24 are clients to server 14 in this example. Computer system 10 may include additional servers, clients, and other devices not shown, or may include fewer devices than those shown.

In the depicted example, network 12 may be or may include the Internet. Computer system 10 also may be implemented with a number of different types of networks, such as for example, an intranet, a local area network (LAN), or a wide area network (WAN). FIG. 1 is intended as an example, and not as an architectural limitation for the different illustrative embodiments.

With reference now to FIG. 2, a block diagram of an exemplary data processing system 30 is shown in which illustrative embodiments may be implemented. Data processing system 30 is an example of a computer, such as server 14 or client computer 20 in FIG. 1, in which computer-usable program code or instructions implementing the processes may be located for the illustrative embodiments. In this illustrative example, data processing system 30 may include communications fabric 32, which provides communications between a processor unit 34, a memory 36, a persistent storage 38, a communications unit 40, an input/output (I/O) unit 42, and a display 44. In other examples, a data processing system may include more or fewer devices.

Processor unit 34, also referred to simply as a processor, may serve to execute instructions for software that may be loaded into memory 36 from persistent storage 38. Processor unit 34 may be a set of one or more processors or may be a multi-processor core, depending on the particular implementation. Further, processor unit 34 may be implemented using one or more heterogeneous processor systems in which a main processor is present with secondary processors on a single chip. As another illustrative example, processor unit 34 may be a symmetric multi-processor system containing multiple processors of the same type.

Memory 36 and persistent storage 38 are examples of storage devices. A storage device is any piece of hardware that is capable of storing information either on a temporary basis and/or a permanent basis. Memory 36, in these examples, may be, for example, a random access memory or any other suitable volatile or non-volatile storage device. Persistent storage 38 may take various forms depending on the particular implementation. For example, persistent storage 38 may contain one or more components or devices. For example, persistent storage 38 may be a hard drive, a flash memory, a rewritable optical disk, a rewritable magnetic tape, or some combination of the above. The media used by persistent storage 38 also may be removable. For example, a removable hard drive may be used for persistent storage Communications unit 40, in these examples, provides for communications with other data processing systems or devices. For example, communications unit 40 may be a network interface card. Communications unit 40 may provide communications through the use of either or both physical and wireless communications links.

Input/output unit 42 allows for input and output of data with other devices that may be connected to data processing system 30. For example, input/output unit 42 may provide a connection for user input through a keyboard and mouse. Further, input/output unit 42 may send output to a printer. Display 44 displays information to a user.

Instructions for the operating system and applications or programs are located on persistent storage 38. These instructions may be loaded into memory 36 for execution by processor unit 34. The processes of the different embodiments may be performed by processor unit 34 using computer implemented instructions, which may be located in a memory, such as memory 36. These instructions are referred to as program code, computer-usable program code, or computer-readable program code that may be read and executed by a processor in processor unit 34. The program code in the different embodiments may be embodied on different physical or tangible computer-readable media, such as memory 36 or persistent storage 38.

Program code 50 may be located in a functional form on a computer-readable media 52 that is resident on a local or remote storage device or is selectively removable and may be loaded onto or transferred to data processing system 30 for execution by processor unit 34. Program code 50 and computer-readable media 52 form computer program product 54 in these examples. In one example, computer-readable media 52 may be in a tangible form, such as, for example, an optical or magnetic disc that is inserted or placed into a drive or other device that is part of persistent storage 38 for transfer onto a storage device, such as a hard drive that is part of persistent storage 38. In a tangible form, computer-readable media 52 also may take the form of a persistent storage, such as a hard drive, a thumb drive, or a flash memory that is connected to data processing system 30. The tangible form of computer-readable media 52 is also referred to as computer-recordable storage media. In some instances, computer-recordable media 52 may not be removable.

Alternatively, program code 50 may be transferred to data processing system 30 from computer-readable media 52 through a communications link to communications unit 40 and/or through a connection to input/output unit 42. The communications link and/or the connection may be physical or wireless, or a combination of physical and wireless in the illustrative examples. The computer-readable media also may take the form of non-tangible media, such as communications links or wireless transmissions containing the program code. The different components illustrated for data processing system 30 are not meant to provide architectural limitations to the manner in which different embodiments may be implemented. The different illustrative embodiments may be implemented in a data processing system including components in addition to or in place of those illustrated for data processing system 30. Other components shown in FIG. 2 can be varied from the illustrative examples shown. As one example, a storage device in data processing system 30 is any hardware apparatus that may store data. Memory 36, persistent storage 38, and computer-readable media 52 are examples of storage devices in tangible forms.

In another example, a bus system may be used to implement communications fabric 32 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 36 or a cache such as found in an interface and memory controller hub that maybe present in communications fabric 32.

Figure 3:
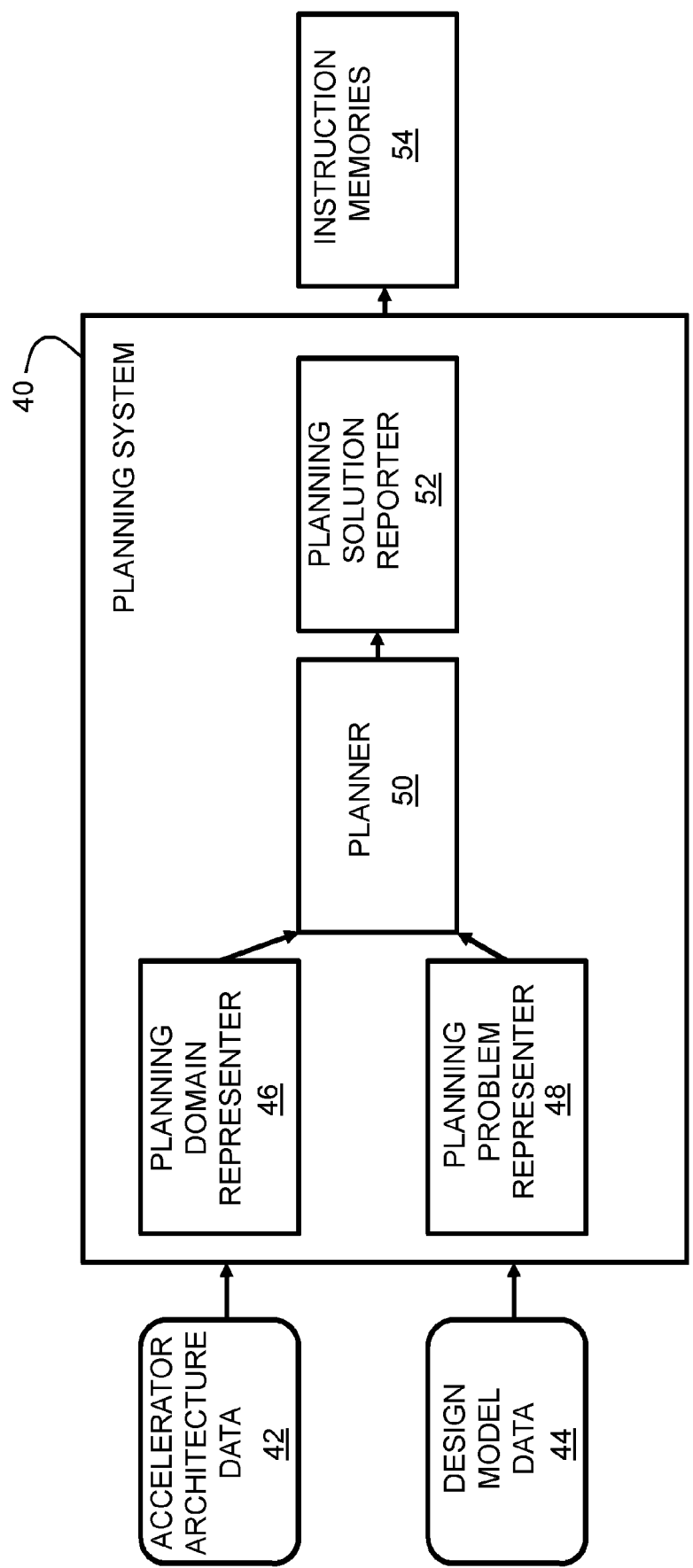
FIG. 3 is a block diagram of an example of a planning system in which illustrative embodiments may be implemented.

With reference now to FIG. 3, an illustrative example of a planning system 40 for hardware-accelerated functional verification is depicted. Planning system 40 may be an example of computer system 10 adapted to plan functional verification of a circuit design. Planning system 40 may receive accelerator architecture data 42 and design model data 44. The accelerator architecture data may include a description of architecture of one or more hardware accelerators for accelerating functional verification of a circuit design. For example, the accelerator architecture data may include information regarding logical processors, registers (such as internal shift registers, broadcasting registers, and select registers), multiplexers, and data memory read ports. The information may include quantity, size (such as number of bits), number of inputs and/or outputs, etc.

Design model data 44 may include a behavioral description of the functionality of a circuit design (such as a microprocessor or controller). The description may, for example, be in the form of a gate-level logical netlist. The netlist may include a set of gates and a set of nets, where each net maps a source gate to a set of sinks.

Planning system 40 may include a planning domain representer 46, a planning problem representer 48, a planner 50, and a planning solution reporter 52. The planning domain representer may be configured to receive accelerator architecture data 42 and/or design model data 44 and define a planning domain for a planner based on the received data. The planning domain may include rules, constraints, and/or allowable sets of actions based on the accelerator's architecture. Planning domain representer 46 may define a planning domain for each accelerator architecture.

Planning problem representer 48 may be configured to receive accelerator architecture data 42 and/or design model data 44 and define objects, an initial state specification, and a goal state specification for a planner. The objects may include gates of the design model, stages of the functional verification, and logical processors of the hardware accelerator. The stages may be associated with numeric times or integers to allow for inequality comparisons by a planner. Initial state specification may include gates that have not been scheduled for execution by a logical processor during a stage of the functional verification, nets and their source-sink relationships (which may be declared by the planning problem representer as pairwise edges), and/or other information. Goal state specification may include that each gate of the netlist (or portion of the netlist) is scheduled for execution by a logical processor during a stage of the functional verification.

The outputs of planning domain representer 46 and planning problem representer 48 may then be used as inputs to a planning engine, such as planner 50, which may create a functional verification schedule that minimizes one or more objective criteria, such as simulation makespan. The outputs may be in any suitable formats usable by the planning engine, such as in Planning Domain Definition Language (PDDL).

Planner 50 may be configured to receive data from planning domain representer 46 and planning problem representer 48 and create a functional verification schedule that meets the goal state specification. For example, planner 50 may be configured to construct a plurality of partial gate schedules based on the received data, such as the represented objects and/or represented pairwise edges. Each partial gate schedule may dictate execution of one or more gates in the netlist by one or more logical processors of the hardware accelerator during one or more stages of the functional verification. For example, a partial gate schedule may dictate (1) execution of gate A by logical processor 1 during stage 1 of the functional verification and (2) execution of gate B by logical processor 0 during stage 2 of the functional verification.

Additionally, planner 50 may be configured to construct a plurality of partial routing schedules based on the received data, such as the represented objects and/or represented pairwise edges. Each partial routing schedule may dictate routing of one or more values of one or more gates in the netlist to one or more other gates that depend on those values during the functional verification. For example, where one or more logical processors include a first internal shift register, a second internal shift register, and a multiplexer, a partial routing schedule may route a value of a gate between a first internal shift register and a second internal shift register, between the second internal shift register and a multiplexer (or operand select), between the first internal shift register and the multiplexer, and/or other suitable combinations. The partial routing schedule(s) may be constructed to minimize and/or avoid the need to route one or more values from logical processor(s) to other logical processor(s), which may require additional stages to write and/or read from memory of the logical processor(s).

Moreover, planner 50 may be configured to combine partial gate schedules with partial routing schedules to form a functional verification schedule that meets the goal state (or a portion of the goal state). Planner 50 may be configured to combine partial gate schedules and partial routing schedules to minimize simulation depth (or makespan) and/or size of the instruction memory required, to maximize simulation speed during functional verification, and/or to minimize and/or maximize other suitable metrics. For example, planner 50 may be configured to combine partial gate schedules and partial routing schedules such that, during the functional verification, a total number of stages required to (1) execute all gates in the netlist (or portion of the netlist) and/or (2) route all values to all the gates in (1) that depend on the values, is less than any other combination of partial gate schedules and partial routing schedules.

Planner 50 may combine partial gate schedules with partial routing schedules in any suitable way(s). For example, the planner may combine partial gate schedules and partial routing schedules in an ordered, consecutive manner starting from the initial state until the goal state is satisfied. Alternatively, planner 50 may combine partial gate schedules and partial routing schedules in a non-ordered, non-consecutive manner until the goal state is satisfied. Any suitable planning engine may be used as planner 50, such as domain-independent planners with state-space planning algorithms or partial-order planning algorithms. Examples of suitable planners include LPG, Local Search for Planning Graphs (Gerevini et al.), GraphPlan (Blum et al.), and/or variations of the above planners. Planning solution reporter 52 may be configured to format and/or compile the functional verification schedule and/or install that schedule in memory of the hardware accelerator(s), such as one or more instruction memories 54 of the logical processor(s) of the accelerator(s). The planning solution representer may format and/or convert the schedule so that it is readable by the logical processor(s) of the accelerator(s).

Figure 4:
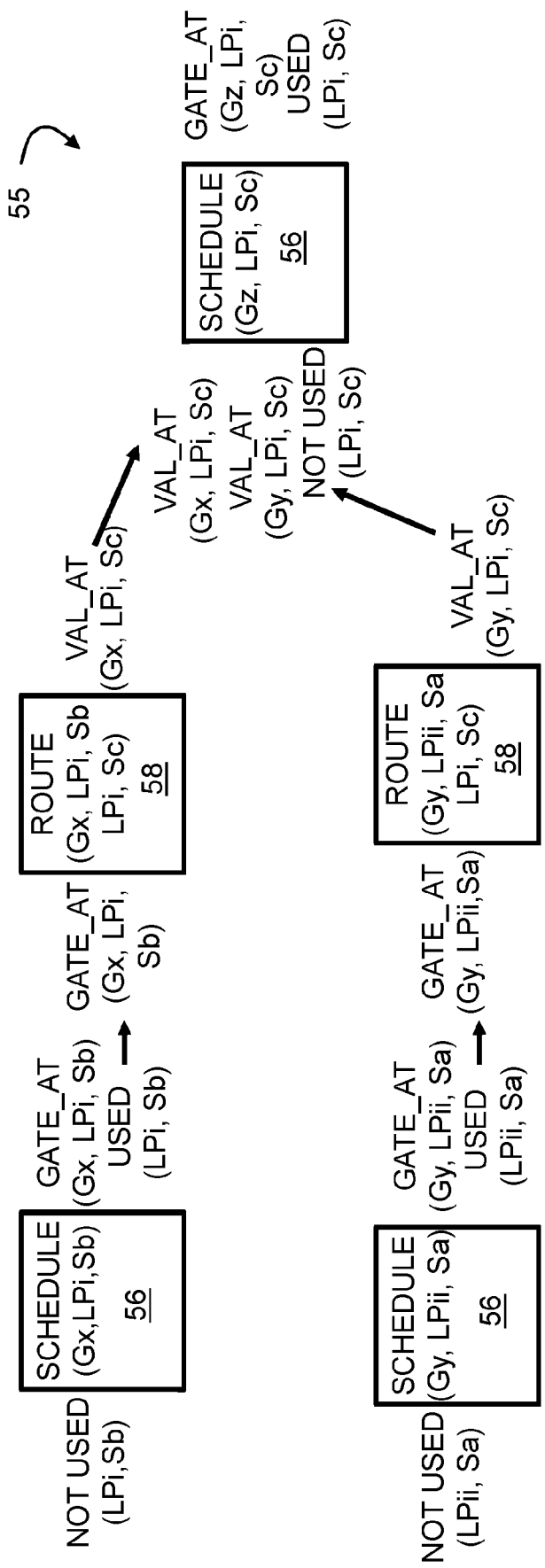
FIG. 4 is a block diagram of an example of a combination of a partial gate schedule and a partial routing schedule generated by a planner of the planning system of FIG. 3 in accordance with the principles of the present inventions.

Referring now to FIG. 4, an example of a combination 55 of a partial gate schedule and a partial routing schedule generated by planner 50 is depicted. Based on the represented objects and represented pairwise edges, planner 50 may combine one or more scheduling actions 56 and one or more routing actions 58 until the goal state (or a portion of the goal state) is satisfied. Each scheduling action 56 to schedule a gate to be executed on a logical processor at a particular stage of the functional verification may include one or more preconditions that must be true for the action to be performed. For example, each scheduling action to schedule gates Gx and/or Gy to be executed by logical processors LPi and/or LPii at particular stages Sa and/or Sb of the functional verification may include a precondition that gates Gx and/or Gy are not used during those stage(s). Additionally, the scheduling action to schedule gate Gz to be executed by logical processor LPi at stage Sc may include preconditions that the values of gates Gx and Gy are available to that logical processor at that stage and/or logical processor LPi is not used.

Each scheduling action 56 may include an effect of the action, such as execution of particular gates and use of particular logical processor at particular stages of the functional verification. For example, the effect of scheduling gate Gx to be executed on logical processor LPi at stage Sb is that gate Gx is executed at logical processor LPi at stage Sb and logical processor LPi is used at stage Sb. Additionally, the effect of scheduling gate Gy to be executed on logical processor LPii at stage Sa is that gate Gy is executed at logical processor LPii at stage Sa and that logical processor LPii is used at stage Sa. Moreover, the effect of scheduling gate Gz to be executed on logical processor LPi at stage Sc is that gate Gz is executed at logical processor LPi at stage Sc and that logical processor LPi is used at stage Sc.

Each routing action 58 to route a value of a gate from one component to another component of the hardware accelerator may include a precondition that must be true for the action to be performed. For example, each routing action to route the values of gates Gx and Gy to, for example, operand select of logical processor LPi may include a precondition that gates Gx and Gy were executed at particular stages prior to the routing actions. Similarly, each routing action 58 may include an effect of the actions, such as the availability of values of the gates at particular stages of the functional verification. For example, the effects of routing values of gates Gx and Gy during stage Sc is that those values are available at the operand select of logical processor LPi. Planner 50 may continue to combine scheduling actions 56 and routing actions 58 as long as preconditions are met for each action selected (for example, resources have not yet been consumed and/or values of sources are available) until the goal state is satisfied.

Figure 5:
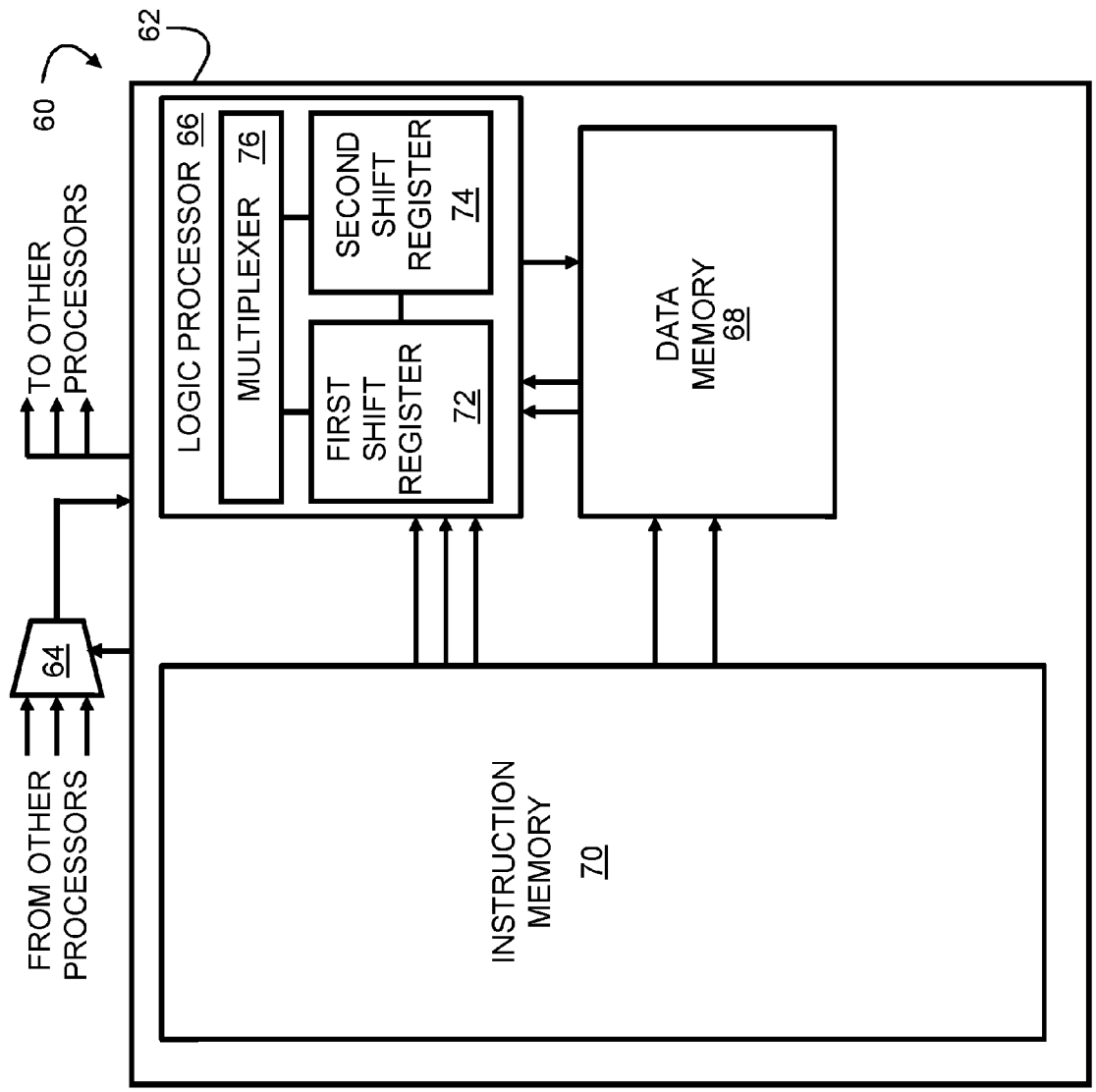
FIG. 5 is a block diagram of an example of architecture of a hardware accelerator in which illustrative embodiments may be implemented.

Referring now to FIG. 5, an example of architecture of a hardware accelerator 60 is depicted. The hardware accelerator may include a plurality of logic processor assemblies 62 interconnected via one or more multiplexers 64 and/or other suitable components. Each logic processor assembly may include a logic processor 66, a data memory 68, and an instruction memory 70. Logic processor 66 may be configured to fetch instructions from instruction memory 70, decode the instructions, evaluate the operations, and store the results in data memory 68.

Logic processor 66 may include one or more internal shift registers, such as a first shift register 72 and/or a second shift register 74. The first shift register (such as a fn_out register) may be configured to retain data, such as gate values. First shift register 72 may act effectively as a fixed-width queue, whose contents advance automatically each stage of the functional verification. Second shift register 74 (such as a recycle register) may be configured to retain data, such as gate values. Second shift register 74 may retain data longer than allowed by the first shift register. The second shift register may, for example, store one or more values at any stage of the functional verification. Additionally, logic processor 66 may include a multiplexer 76 (or operand select) configured to retain data, such as storing one or more values at any stage of the functional verification. The first shift register, second shift register, and/or multiplexer may be interconnected to allow for routing of gate values. Planner 50 may route one or more values among the first shift register, second shift register, multiplexer, and/or other components so that those values are available to one or more logical processors without the need to write to and/or read from memory.

Figure 6:
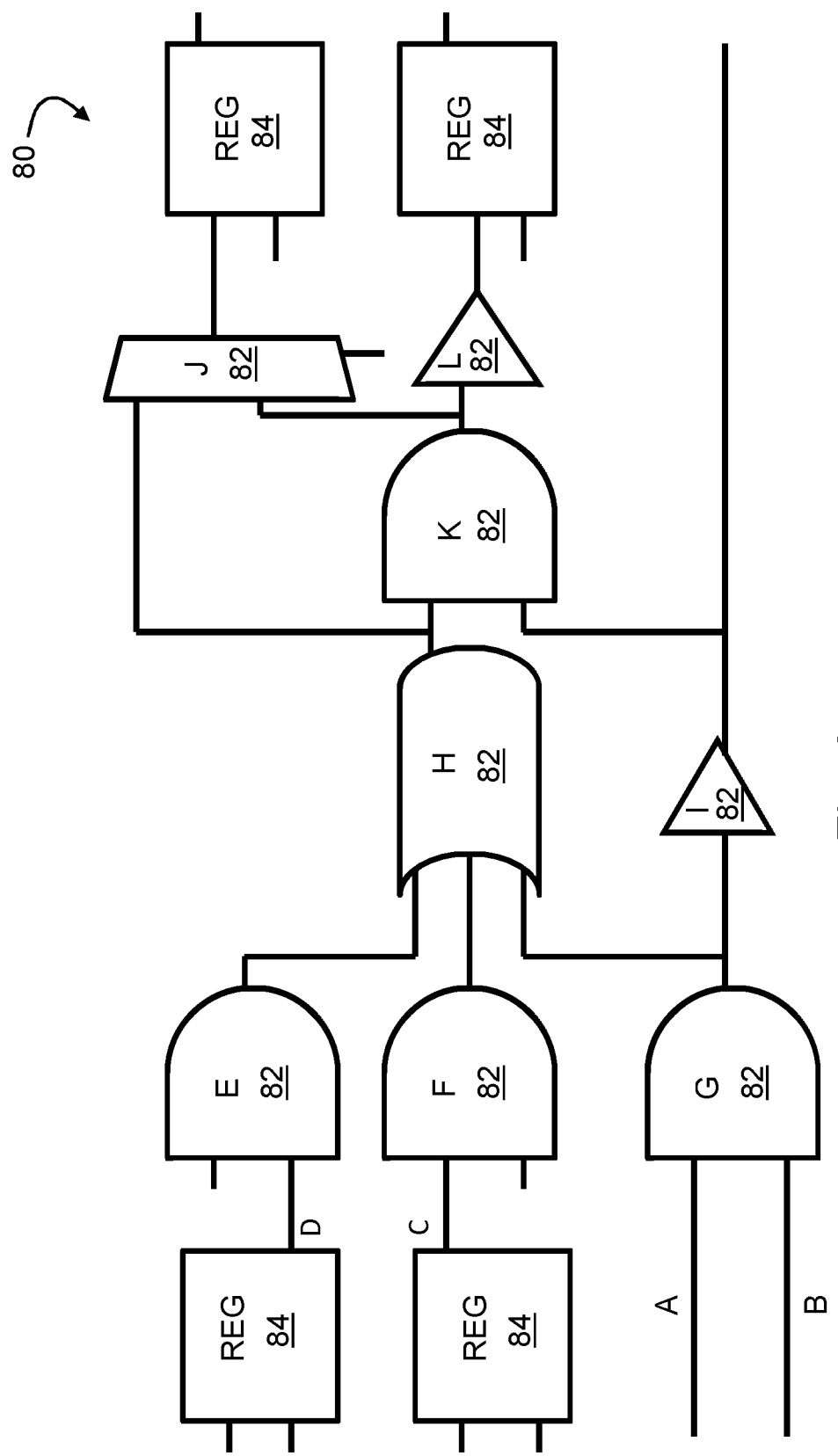
FIG. 6 is a block diagram of an example of a design model in accordance with the principles of the present inventions.

Referring now to FIG. 6, an example of a portion of a netlist 80 is depicted. The netlist includes a plurality of gates 82, such as gates E, F, G, H, I, J, K, and L. One or more gates may receive gate values from other gates via one or more registers 84. For example, gate values C and D are from registers 84. Additionally, the value of one or more gates may be stored in registers 84. Moreover, one or more gates may need output of each of its sources before the gates may be evaluated. For example, before gate H may be evaluated, the output of each of gates F and G must be known. However, one or more gates may be evaluated independently from one another that may allow planner 50 to schedule some computations concurrently.

Figure 7:
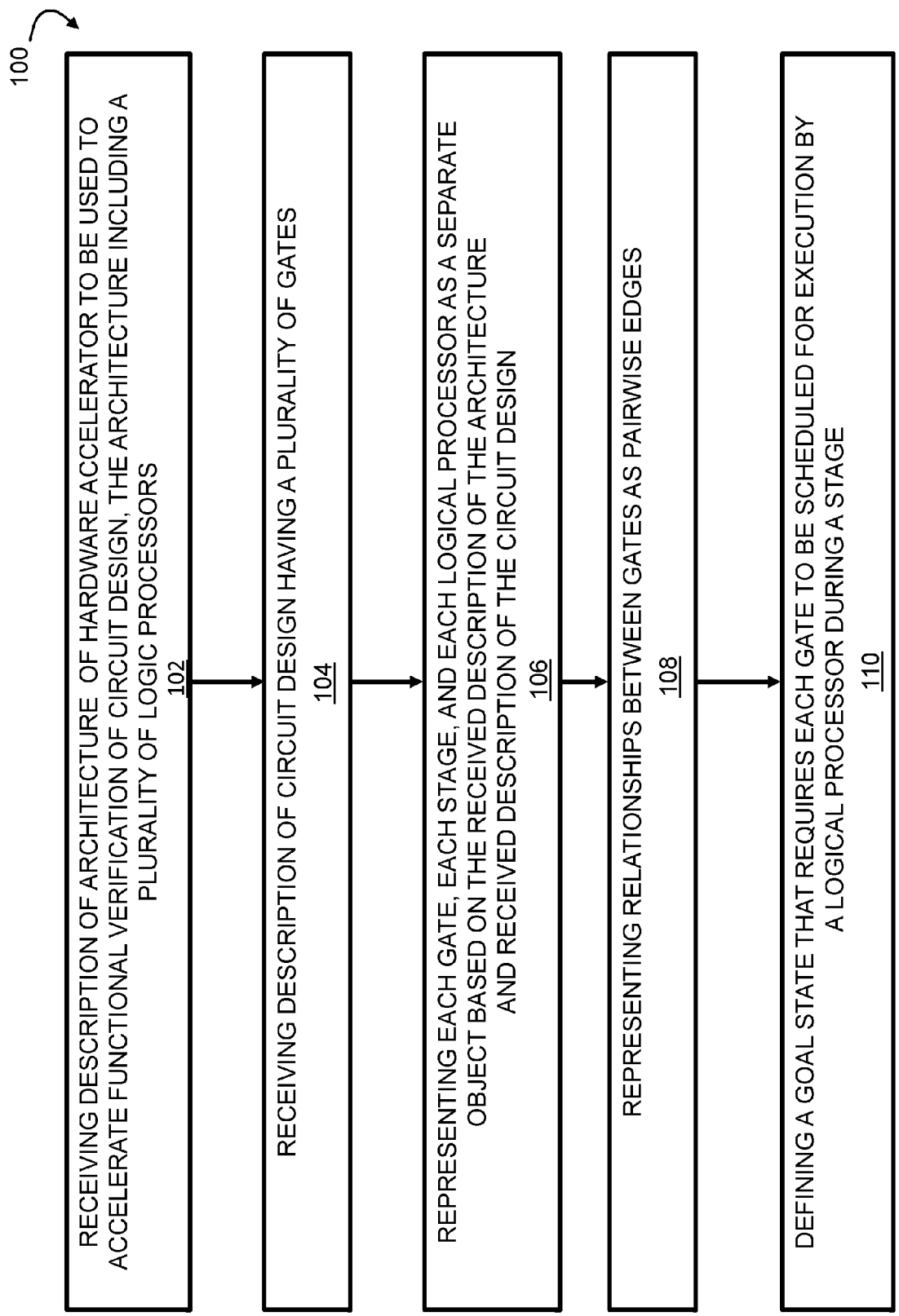
FIG. 7 is a flow chart of an example of a method of planning hardware-accelerated functional verification in accordance with the principles of the present inventions.

Referring now to FIG. 7, an example of a method 100 for planning hardware-accelerated functional verification is depicted. While FIG. 7 shows illustrative steps of a method according to one embodiment, other embodiments may omit, add to, and/or modify any of the steps shown in that figure. In step 102, a description of architecture of a hardware accelerator for accelerating functional verification of a circuit design may be received. The architecture may include a plurality of logic processors. In step 104, a description of a circuit design having a plurality of gates is received. In step 106, each gate, each stage, and each logical processor may be represented as a separate object based on the received description of the architecture and received description of the circuit design. In step 108, relationships between gates may be represented as pairwise edges. In step 110, a goal state that requires each gate to be scheduled for execution by a logical processor during a stage may be defined. The above steps may be taken to allow a planning engine to create a functional verification based on the represented objects, represented pairwise edges, and the goal state.

Method 100 may include additional steps. For example, method 100 may include defining an initial state that described one or more gates that have not been scheduled for execution by a logical processor during a stage of the functional verification. Additionally, method 100 may include constructing, based on the represented objects and represented pairwise edges, a plurality of partial gate schedules with each partial gate schedule dictating execution of one or more gates by one or more logical processors during one or more stages.

Moreover, method 100 may include constructing, based on the represented objects and represented pairwise edges, a plurality of partial routing schedules with each partial routing schedule dictating routing of one or more values of one or more gates to one or more other gates that depend on those values. For example, one or more partial routing schedules may dictate routing one or more values among various components, such as a multiplexer, a first internal shift register, and/or a second internal shift register. In some embodiments, the partial routing schedules may seek to minimize and/or avoid the need to route one or more values from one or more logical processors to one or more other logical processors. In some embodiments, the partial routing schedules may seek to minimize and/or avoid the need to write the value(s) to and/or read the value(s) from memory of the logical processor(s).

Furthermore, method 100 may include combining two or more partial gate schedules and two or more partial routing schedules to form a functional verification schedule that meets the goal state such that, during the functional verification, a total number of stages required to (1) execute all gates and/or (2) route all values to all gates that depend on those values, is less than any other combination of two or more partial gate schedules and two or more partial routing schedules. In some embodiments, the partial gate schedules and partial routing schedules may be combined in an ordered, consecutive manner starting from the initial state until the goal state is satisfied. In some embodiments, the partial gate schedules and partial routing schedules may be combined in a non-ordered, non-consecutive manner until the goal state is satisfied. Additionally, method 100 may include installing the functional verification schedule in memory of the hardware accelerator.

The terminology used herein is for the purpose of describing particular embodiments only and is not intended to be limiting of the described inventions. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present inventions has been presented for purposes of illustration and description, but is not intended to be exhaustive or limited to the inventions in the form disclosed. For example, the invention may be embodied in an environment that is not part of a revision control system. Many modifications and variations will be apparent to those of ordinary skill in the art without departing from the scope and spirit of the inventions. The embodiments were chosen and described in order to best explain the principles of the inventions and the practical application, and to enable others of ordinary skill in the art to understand the inventions for various embodiments with various modifications as are suited to the particular use contemplated.

What is claimed is:

1. A method, comprising:
    receiving, by a computer system, a description of architecture of a hardware accelerator for accelerating functional verification of a circuit design, the architecture including a plurality of logical processors;
    receiving, by the computer system, a description of the circuit design having a plurality of gates;
    representing, by the computer system, each gate of the plurality of gates, each stage of a plurality of stages of the functional verification, and each logical processor of the plurality of logical processors as a separate object based on the received description of the architecture and the received description of the circuit design;
    representing, by the computer system, relationships between gates of the plurality of gates as pairwise edges;
    defining, by the computer system, a goal state that requires each gate of the plurality of gates to be scheduled for execution by a logical processor of the plurality of logical processors during a stage of the plurality of stages of the functional verification;
    constructing, by the computer system and based on the represented objects and the represented pairwise edges, a plurality of partial gate schedules with each partial gate schedule of the plurality of partial gate schedules dictating execution of one or more gates of the plurality of gates by one or more logical processors of the plurality of logical processors during one or more stages of the plurality of stages;
    constructing, by the computer system and based on the represented objects and the represented pairwise edges, a plurality of partial routing schedules with each partial routing schedule of the plurality of partial routing schedules dictating routing of one or more values of one or more gates of the plurality of gates to one or more other gates that depend on those values; and
    combining, by the computer system, two or more partial gate schedules of the plurality of partial gate schedules and two or more partial routing schedules of the plurality of partial routing schedules to form a functional verification schedule that meets the goal state, wherein the combined two or more partial routing schedules minimizes routing of one or more values from one or more logical processors of the plurality of logical processors to one or more other logical processors of the plurality of logical processors.

2. The method of claim 1,
    wherein combining, by the computer system, two or more partial gate schedules of the plurality of partial gate schedules and two or more partial routing schedules of the plurality of partial routing schedules to form a functional verification schedule that meets the goal state includes combining, by the computer system, two or more partial gate schedules of the plurality of partial gate schedules and two or more partial routing schedules of the plurality of partial routing schedules to form a functional verification schedule that meets the goal state such that, during the functional verification, a total number of stages required to (1) execute all gates of the plurality of gates and (2) route all values to all gates that depend on those values, is less than any other combination of two or more partial gate schedules of the plurality of partial gate schedules and two or more partial routing schedules of the plurality of partial routing schedules.

3. The method of claim 2, where at least one logical processor of the plurality of logical processors includes a first internal shift register and a second internal shift register, wherein constructing, by the computer system and based on the represented objects and the represented pairwise edges, a plurality of partial routing schedules with each partial routing schedule of the plurality of partial routing schedules dictating routing of one or more values of one or more gates of the plurality of gates to one or more other gates that depend on those values includes constructing, by the computer system and based on the represented objects and the represented pairwise edges, a plurality of partial routing schedules with one or more partial routing schedules dictating routing of one or more values of one or more gates of the plurality of gates between the first and second internal shift registers.

4. The method of claim 3, where the at least one logical processor of the plurality of logical processors further includes a multiplexer, wherein constructing, by the computer system and based on the represented objects and the represented pairwise edges, a plurality of partial routing schedules with one or more partial routing schedules dictating routing of one or more values of one or more gates of the plurality of gates between the first and second internal shift registers includes constructing, by the computer system and based on the represented objects and the represented pairwise edges, a plurality of partial routing schedules with one or more partial routing schedules dictating routing of one or more values of one or more gates of the plurality of gates among the first and second internal shift registers and the multiplexer.

5. The method of claim 3, where one or more logical processors of the plurality of logical processors includes at least one of a first internal shift register, a second internal shift register, and a multiplexer, wherein constructing, by the computer system and based on the represented objects and the represented pairwise edges, a plurality of partial routing schedules with one or more partial routing schedules dictating routing of one or more values of one or more gates of the plurality of gates between the multiplexer and one of the first and second internal shift registers includes constructing by the computer system and based on the represented objects and the represented pairwise edges, a plurality of partial routing schedules with one or more partial routing schedules dictating routing of one or more values of one or more gates of the plurality of gates among the at least one of a first internal shift register, a second internal shift register, and a multiplexer to avoid routing one or more values from one or more logical processors of the plurality of logical processors to one or more other logical processors of the plurality of logical processors.

6. The method of claim 2, further comprising defining, by the computer system, an initial state that describes one or more gates of the plurality of gates that have not been scheduled for execution by a logical processor of the plurality of logical processors during a stage of the plurality of stages of the functional verification.

7. The method of claim 6, wherein combining, by the computer system, two or more partial gate schedules of the plurality of partial gate schedules and two or more partial routing schedules of the plurality of partial routing schedules to form a functional verification schedule that meets the goal state includes combining, by the computer system, two or more partial gate schedules of the plurality of partial gate schedules and two or more partial routing schedules of the plurality of partial routing schedules in an ordered, consecutive manner starting from the initial state until the goal state is satisfied.

8. The method of claim 2, wherein combining, by the computer system, two or more partial gate schedules of the plurality of partial gate schedules and two or more partial routing schedules of the plurality of partial routing schedules to form a functional verification schedule that meets the goal state includes combining, by the computer system, two or more partial gate schedules of the plurality of partial gate schedules and two or more partial routing schedules of the plurality of partial routing schedules in a non-ordered, non-consecutive manner until the goal state is satisfied.

9. The method of claim 2, further comprising installing, by the computer system, the functional verification schedule in memory of the hardware accelerator.

10. A computer system, comprising:
a processor;
a memory; and
a program comprising a plurality of instructions stored in the memory that are executed by the processor to:
receive a description of architecture of a hardware accelerator for accelerating functional verification of a circuit design, the architecture including a plurality of logical processors;
receive a description of the circuit design having a plurality of gates;
represent each gate of the plurality of gates, each stage of a plurality of stages of the functional verification, and each logical processor of the plurality of logical processors as a separate object based on the received description of the architecture and the received description of the circuit design;
represent relationships between gates of the plurality of gates as pairwise edges;
define a goal state that requires each gate of the plurality of gates to be scheduled for execution by a logical processor of the plurality of logical processors during a stage of the plurality of stages of the functional verification;
construct, based on the represented objects and the represented pairwise edges, a plurality of partial gate schedules with each partial gate schedule of the plurality of partial gate schedules dictating execution of one or more gates of the plurality of gates by one or more logical processors of the plurality of logical processors during one or more stages of the plurality of stages;
construct, based on the represented objects and the represented pairwise edges, a plurality of partial routing schedules with each partial routing schedule of the plurality of partial routing schedules dictating routing of one or more values of one or more gates of the plurality of gates to one or more other gates that depend on those values; and
combine two or more partial gate schedules of the plurality of partial gate schedules and two or more partial routing schedules of the plurality of partial routing schedules to form a functional verification schedule that meets the goal state, wherein the combined two or more partial routing schedules minimizes at least one of (1) writing one or more values from memory of one or more logical processors of the plurality of logical processors and (2) reading of one or more values from memory of one or more logical processors of the plurality of logical processors.

11. The computer system of claim 10, wherein the plurality of instructions further comprises instructions that are executed by the processor to;
combine two or more partial gate schedules of the plurality of partial gate schedules and two or more partial routing schedules of the plurality of partial routing schedules to form a functional verification schedule that meets the goal state such that, during the functional verification, a total number of stages required to (1) execute all gates of the plurality of gates and (2) route all values to all gates that depend on those values, is less than any other combination of two or more partial gate schedules of the plurality of partial gate schedules and two or more partial routing schedules of the plurality of partial routing schedules.

12. The computer system of claim 11, wherein the plurality of instructions further comprises instructions that are executed by the processor to construct, based on the represented objects and the represented pairwise edges, a plurality of partial routing schedules with one or more partial routing schedules dictating routing of one or more values of one or more gates of the plurality of gates between first and second internal shift registers of at least one logical processor of the plurality of logical processors.

13. The computer system of claim 12, wherein the plurality of instructions further comprises instructions that are executed by the processor to construct, based on the represented objects and the represented pairwise edges, a plurality of partial routing schedules with one or more partial routing schedules dictating routing of one or more values of one or more gates of the plurality of gates among the first and second internal shift registers and a multiplexer of the at least one logical processor.

14. The computer system of claim 11, wherein the plurality of instructions further comprises instructions that are executed by the processor to construct, based on the represented objects and the represented pairwise edges, a plurality of partial routing schedules with one or more partial routing schedules dictating routing of one or more values of one or more gates of the plurality of gates among at least one of a first internal shift register, a second internal shift register, and a multiplexer of at least one logical processor of the plurality of logical processors to avoid routing one or more values from one or more logical processors of the plurality of logical processors to one or more other logical processors of the plurality of logical processors.

15. The computer system of claim 11, wherein the plurality of instructions further comprises instructions that are executed by the processor to define an initial state that describes one or more gates of the plurality of gates that have not been scheduled for execution by a logical processor of the plurality of logical processors during a stage of the plurality of stages of the functional verification.

16. The computer system of claim 15, wherein the plurality of instructions further comprises instructions that are executed by the processor to combine two or more partial gate schedules of the plurality of partial gate schedules and two or more partial routing schedules of the plurality of partial routing schedules in an ordered, consecutive manner starting from the initial state until the goal state is satisfied.

17. The computer system of claim 11, wherein the plurality of instructions further comprises instructions that are executed by the processor to combine two or more partial gate schedules of the plurality of partial gate schedules and two or more partial routing schedules of the plurality of partial routing schedules in a non-ordered, non-consecutive manner until the goal state is satisfied.

18. The computer system of claim 11, wherein the plurality of instructions further comprises instructions that are executed by the processor to install the functional verification schedule in memory of the hardware accelerator.

19. A computer program product for planning hardware-accelerated functional verification, the computer program product comprising:
at least one non-transitory computer readable storage medium having computer readable program instructions embodied therewith, the computer readable program instructions, when read by a processor, being configured to:
receive a description of architecture of a hardware accelerator for accelerating functional verification of a circuit design, the architecture including a plurality of logical processors;
receive a description of the circuit design having a plurality of gates;
represent each gate of the plurality of gates, each stage of a plurality of stages of the functional verification, and each logical processor of the plurality of logical processors as a separate object based on the received description of the architecture and the received description of the circuit design;
represent relationships between gates of the plurality of gates as pairwise edges;
define a goal state that requires each gate of the plurality of gates to be scheduled for execution by a logical processor of the plurality of logical processors during a stage of the plurality of stages of the functional verification;
construct, based on the represented objects and the represented pairwise edges, a plurality of partial gate schedules with each partial gate schedule of the plurality of partial gate schedules dictating execution of one or more gates of the plurality of gates by one or more logical processors of the plurality of logical processors during one or more stages of the plurality of stages;
construct, based on the represented objects and the represented pairwise edges, a plurality of partial routing schedules with each partial routing schedule of the plurality of partial routing schedules dictating routing of one or more values of one or more gates of the plurality of gates to one or more other gates that depend on those values; and
combine two or more partial gate schedules of the plurality of partial gate schedules and two or more partial routing schedules of the plurality of partial routing schedules to form a functional verification schedule that meets the goal state, wherein the combined two or more partial routing schedules minimizes routing of one or more values from one or more logical processors of the plurality of logical processors to one or more other logical processors of the plurality of logical processors.

20. The computer program product of claim 19, wherein the computer readable program instructions, when read by a processor, are further configured to:
combine two or more partial gate schedules of the plurality of partial gate schedules and two or more partial routing schedules of the plurality of partial routing schedules to form a functional verification schedule that meets the goal state such that, during the functional verification, a total number of stages required to (1) execute all gates of the plurality of gates and (2) route all values to all gates that depend on those values, is less than any other combination of two or more partial gate schedules of the plurality of partial gate schedules and two or more partial routing schedules of the plurality of partial routing schedules.

21. The computer program product of claim 20, wherein the computer readable program instructions, when read by a processor, are further configured to construct, based on the represented objects and the represented pairwise edges, a plurality of partial routing schedules with one or more partial routing schedules dictating routing of one or more values of one or more gates of the plurality of gates among at least one of a first internal shift register, a second internal shift register, and a multiplexer of at least one logical processor of the plurality of logical processors to avoid routing one or more values from one or more logical processors of the plurality of logical processors to one or more other logical processors of the plurality of logical processors.

22. The computer program product of claim 20, wherein the computer readable program instructions, when read by a processor, are further configured to define an initial state that describes one or more gates of the plurality of gates that have not been scheduled for execution by a logical processor of the plurality of logical processors during a stage of the plurality of stages of the functional verification.

23. The computer program product of claim 22, wherein the computer readable program instructions, when read by a processor, are further configured to combine two or more partial gate schedules of the plurality of partial gate schedules and two or more partial routing schedules of the plurality of partial routing schedules in an ordered, consecutive manner starting from the initial state until the goal state is satisfied.

24. The computer program product of claim 20, wherein the computer readable program instructions, when read by a processor, are further configured to combine two or more partial gate schedules of the plurality of partial gate schedules and two or more partial routing schedules of the plurality of partial routing schedules in a non-ordered, non-consecutive manner until the goal state is satisfied.

25. The computer program product of claim 20, wherein the computer readable program instructions, when read by a processor, are further configured to install the functional verification schedule in memory of the hardware accelerator.

* * * * *